(12) United States Patent
Li et al.

(10) Patent No.: US 9,165,925 B2
(45) Date of Patent: Oct. 20, 2015

(54) STRUCTURES AND METHODS FOR RING OSCILLATOR FABRICATION

(71) Applicant: Taiwan Semiconductor Manufacturing Company Limited, Hsinchu (TW)

(72) Inventors: Chao-Chieh Li, Hsinchu (TW); Shyh-An Chi, Hsinchu (TW); Ruey-Bin Sheen, Taichung (TW); Chih-Hsien Chang, New Taipei (TW)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 63 days.

(21) Appl. No.: 14/012,378

(22) Filed: Aug. 28, 2013

(65) Prior Publication Data

US 2015/0061782 A1    Mar. 5, 2015

(51) Int. Cl.
*H03K 3/03* (2006.01)
*H01L 27/088* (2006.01)
*H01L 23/00* (2006.01)
*H01L 29/00* (2006.01)

(52) U.S. Cl.
CPC ............. *H01L 27/088* (2013.01); *H01L 24/91* (2013.01); *H01L 29/00* (2013.01); *H03K 3/0315* (2013.01); *H01L 2924/1305* (2013.01)

(58) Field of Classification Search
CPC ..................................... H03K 3/0315
USPC ................. 331/2, 46, 57; 257/66, 499, 777; 326/39; 438/107
See application file for complete search history.

(56) References Cited

U.S. PATENT DOCUMENTS 6,661,299 B2 * 12/2003 Dodabalapur et al. .......... 331/57

* cited by examiner

*Primary Examiner* — Arnold Kinkead
(74) *Attorney, Agent, or Firm* — Jones Day

(57) ABSTRACT

Structures and methods are provided for fabricating a ring oscillator including a plurality of stages. An example multi-layer structure includes a first device layer, a second device layer, and an inter-level connection structure. The first device layer includes a first transistor structure associated with a first stage of a ring oscillator. The second device layer is formed on the first device layer and includes a second transistor structure associated with a second stage of the ring oscillator. Further, the first inter-level connection structure includes one or more first conductive materials and is configured to electrically connect to the first transistor structure and the second transistor structure.

21 Claims, 8 Drawing Sheets

STRUCTURES AND METHODS FOR RING OSCILLATOR FABRICATION

FIELD

The technology described in this patent document relates generally to semiconductor devices and more particularly to fabrication of semiconductor devices.

BACKGROUND

Ring oscillators are widely used in high speed circuit applications, and usually include simple inverting logic circuits as stages. For example, each stage includes an N-channel transistor and a P-channel transistor. The stages are connected in series to form a cascade loop. The current output of each stage charges or discharges an input capacitance of a next stage to a threshold voltage. At a particular frequency, a certain phase shift (e.g., 180°) is imparted to signals passing around the loop. If the loop gain is large enough, the signals may become non-linear resulting in square-wave oscillations which can be used, for example, for signal processing.

SUMMARY

In accordance with various embodiments described herein, structures and methods are provided for fabricating a ring oscillator including a plurality of stages. An example multi-layer structure includes a first device layer, a second device layer, and an inter-level connection structure. The first device layer includes a first transistor structure associated with a first stage of a ring oscillator. The second device layer is formed on the first device layer and includes a second transistor structure associated with a second stage of the ring oscillator. Further, the first inter-level connection structure includes one or more first conductive materials and is configured to electrically connect to the first transistor structure and the second transistor structure.

In an embodiment, a ring oscillator fabricated using a multi-layer structure includes a first stage and a second stage. The first stage includes a first transistor structure formed in a first device layer of the multi-layer structure. The second stage includes a second transistor structure formed in a second device layer of the multi-layer structure. The second device layer is formed on the first device layer. The first transistor structure is configured to electrically connect to the second transistor structure through a first inter-level connection structure including one or more first conductive materials.

In another embodiment, a method is provided for fabricating a ring oscillator including a plurality of stages using a multi-layer structure. A first device layer is formed. The first device layer includes a first transistor structure associated with a first stage of the ring oscillator. An inter-level connection structure is formed. The inter-level connection structure includes one or more first conductive materials, and electrically connects to the first transistor structure. A second device layer is formed on the first device layer. The second device layer includes a second transistor structure associated with a second stage of the ring oscillator, where the second transistor structure electrically connects to the inter-level connection structure.

DETAILED DESCRIPTION

Figure 1:
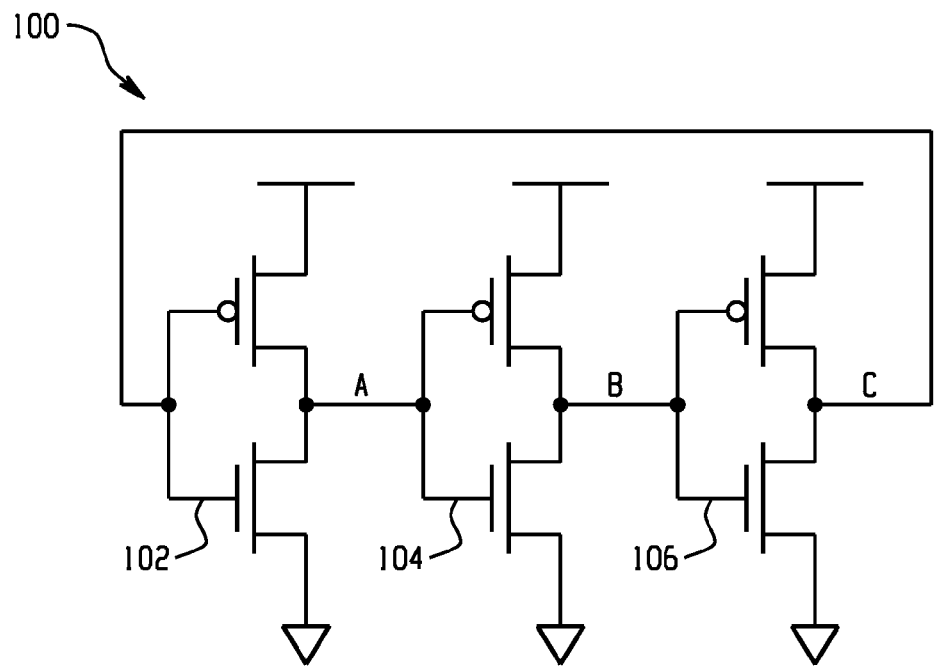
FIG. 1 depicts an example schematic diagram of a three-stage ring oscillator.

FIG. 1 depicts an example schematic diagram of a three-stage ring oscillator 100. As shown in FIG. 1, the ring oscillator 100 includes three stages 102, 104 and 106. As an example, each stage may include an N-channel transistor and a P-channel transistor, where the gate terminals of the N-channel transistor and the P-channel transistor are connected together (e.g., as an input terminal) and the drain terminals of the two transistor are connected (e.g., as an output terminal) as well. A connection line "A" is configured to electrically connect to the output terminal of the first stage 102 and the input terminal of the second stage 104. Similarly, a connection line "B" is configured to electrically connect the output terminal of the second stage 104 and the input terminal of the third stage 106 together, and a connection line "C" is configured to electrically connect the output terminal of the third stage 106 and the input terminal of the first stage 102 together.

If all stages of a ring oscillator (e.g., the ring oscillator 100) are fabricated at approximately a same level on an integrated circuit (IC) chip, the lengths of the connection lines between different stages (e.g., the connection lines "A," "B," and "C") may often be unequal, which may degrade the high-frequency performance of the ring oscillator. Using dummy routing to balance the lengths of different connection lines may usually lead to a waste of layout areas and increase fabrication costs.

Figure 2:
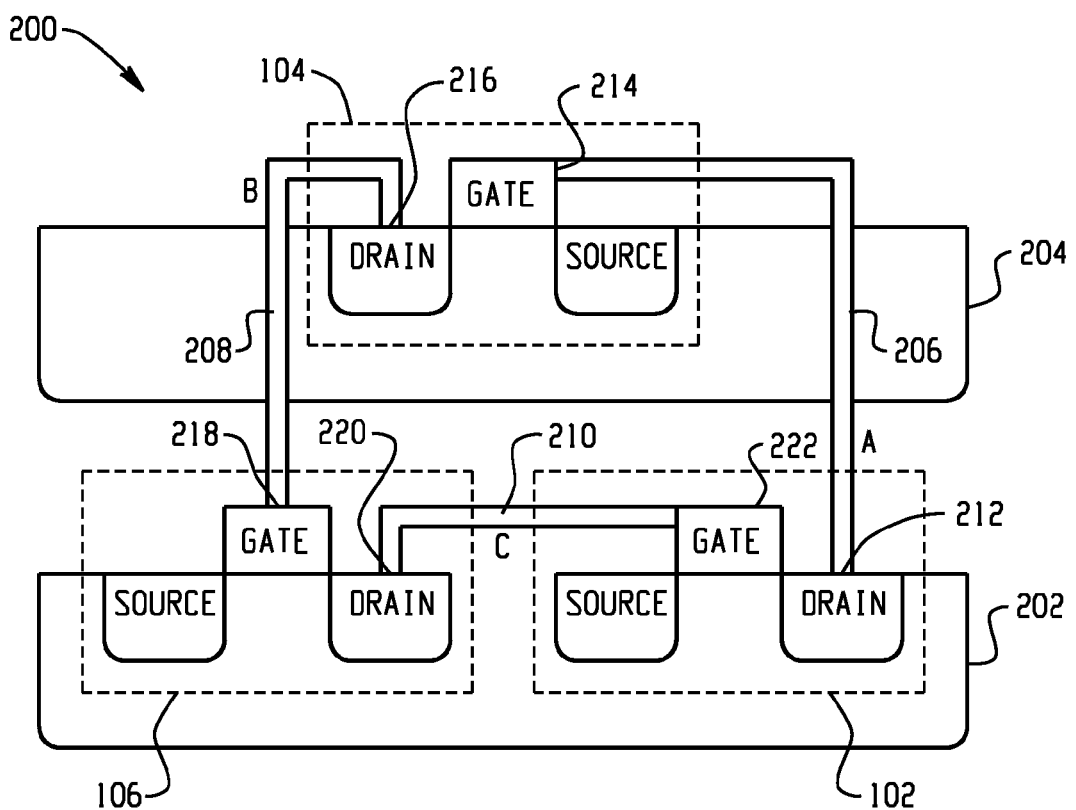
FIG. 2 depicts an example diagram of a two-layer structure used for fabricating the ring oscillator as shown in FIG. 1.

FIG. 2 depicts an example diagram of a two-layer structure used for fabricating the ring oscillator as shown in FIG. 1. As shown in FIG. 2, the two-layer structure 200 includes a first device layer 202 and a second device layer 204. The first stage 102 and the third stage 106 are fabricated in the first device layer 202, and the second stage 104 is fabricated in the second device layer 204. Two inter-level connection structures 206 and 208 (e.g., vias) and an intra-level connection structure 210 (e.g., conductive lines including metal materials) is fabricated for interconnection of the stages 102, 104 and 106.

For example, the inter-level connection structure 206 represents the connection line "A" and may connect an output terminal 212 of the first stage 102 to an input terminal 214 of the second stage 104. The inter-level connection structure 208 represents the connection line "B" and may connect an output terminal 216 of the second stage 104 to an input terminal 218 of the third stage 106. In addition, the intra-level connection structure 210 represents the connection line "C" and may connect an output terminal 220 of the third stage 106 to an input terminal 222 of the first stage 102. As an example, the connection structures 206, 208 and 210 are approximately equal in length. The inter-level connection structures 206 and 208 penetrate at least part of the device layer 204. In some embodiments, the first stage 102 and the third stage 106 is fabricated in the second device layer 204, and the second stage 104 is fabricated in the first device layer 202. As an example, the second device layer 204 is formed on the first device layer 202 through epitaxial growth or wafer bonding. In another example, the inter-level connection structures 206 and 208 (e.g., vias) and the intra-level connection structure 210 (e.g., conductive lines) include one or more conductive materials, such as metal-based materials and crystalline polysilicon.

Figure 3:
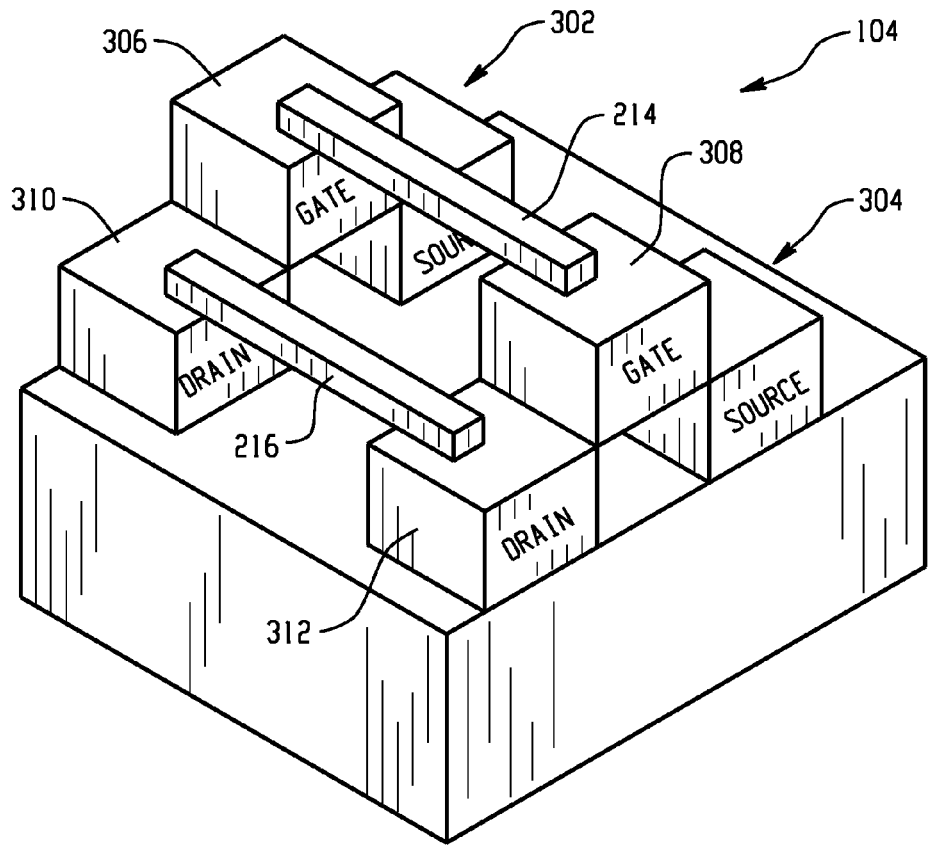
FIG. 3 depicts an example diagram showing transistors in a second stage of a ring oscillator.

Transistors included in a particular stage of the ring oscillator 100 are fabricated in a single device layer, as shown in FIG. 3. FIG. 3 depicts an example diagram showing transistors in the second stage 104 of the ring oscillator 100. As shown in FIG. 3, the second stage 104 of the ring oscillator 100 includes a P-channel transistor 302 and an N-channel transistor 304 that are both fabricated in the device layer 204 (not labeled). A gate terminal 306 of the P-channel transistor 302 is connected to a gate terminal 308 of the N-channel transistor 304 to form the input terminal 214, and a drain terminal 310 of the P-channel transistor 302 is connected to a drain terminal 312 of the N-channel transistor 304 to form the output terminal 216.

Figure 4:
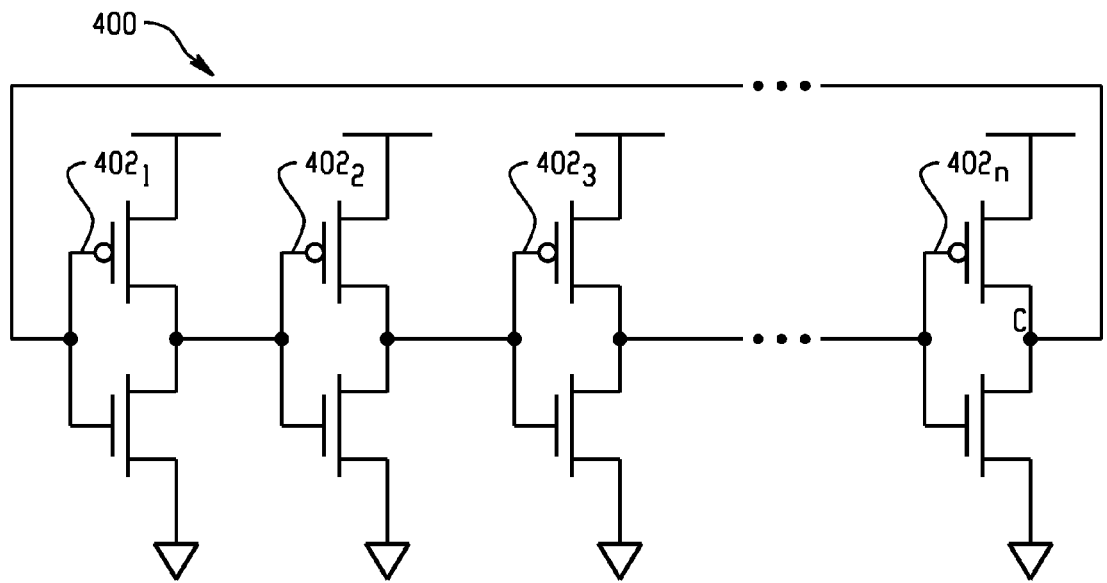
FIG. 4 depicts an example schematic diagram of a multi-stage ring oscillator.

FIG. 4 depicts an example schematic diagram of a multi-stage ring oscillator 100. As shown in FIG. 4, the ring oscillator 400 includes multiple stages $402_1, 402_2, 402_3, \ldots, 402_n$, where n is, for example, an odd number. As an example, each stage may include an N-channel transistor and a P-channel transistor, where the gate terminals of the N-channel transistor and the P-channel transistor are connected together (e.g., as an input terminal) and the drain terminals of the two transistor are connected (e.g., as an output terminal) as well.

Figure 5:
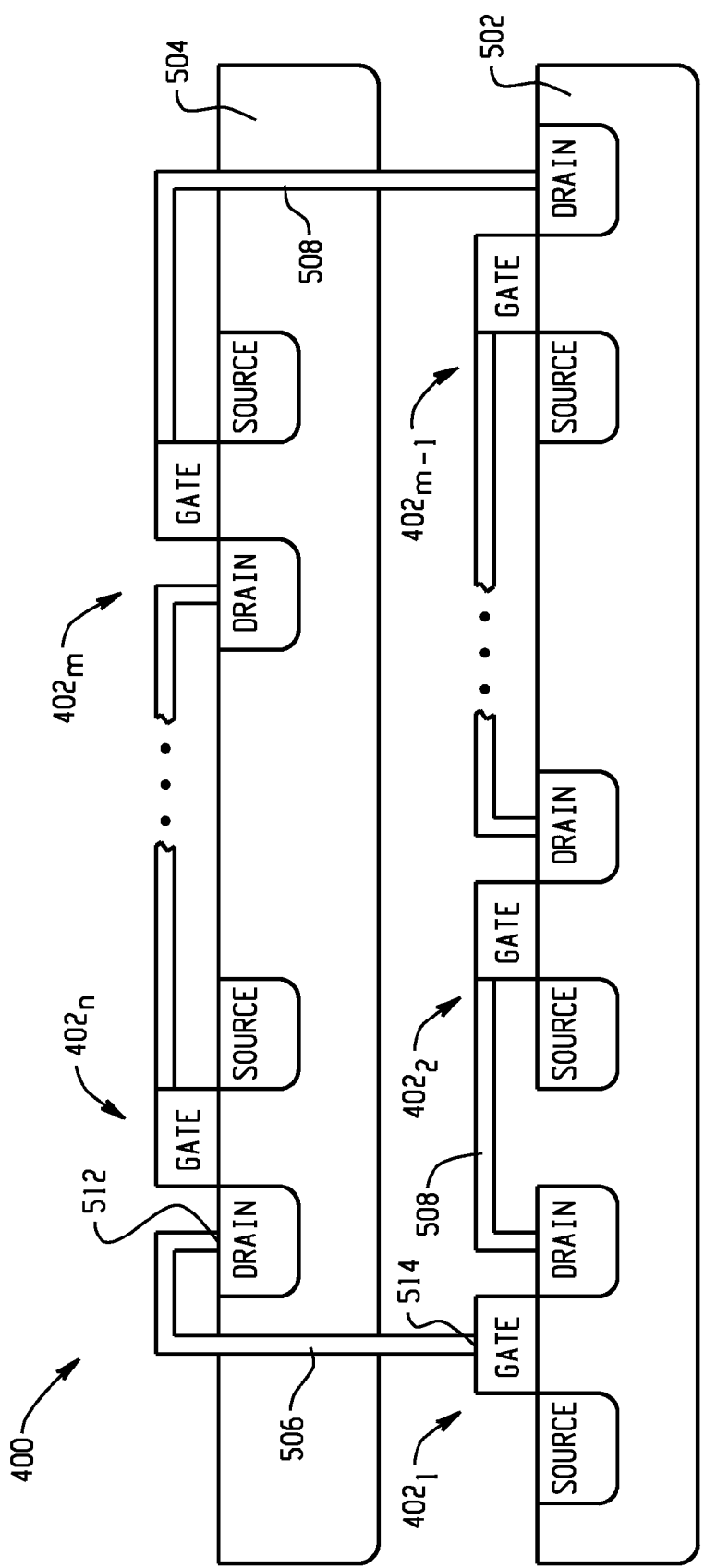
FIG. 5 depicts an example diagram of a two-layer structure used for fabricating the ring oscillator as shown in FIG. 4.

FIG. 5 depicts an example diagram of a two-layer structure used for fabricating the ring oscillator as shown in FIG. 4. As shown in FIG. 5, multiple stages of the ring oscillator 400 are fabricated in two device layers 502 and 504. For example, if n is an odd number larger than 1, the first (n+1)/2 stages of the ring oscillator 400 are fabricated in the first device layer 502, and the rest of the stages of the ring oscillator 400 are fabricated in the second device layer 504. Two inter-level connection structures 506 and 508 and multiple intra-level connection structures (e.g., the connection structure 510) are fabricated for interconnection of the stages of the ring oscillator 400.

For example, the inter-level connection structure 506 connects an output terminal 512 of the last stage $402_n$ to an input terminal 514 of the first stage $402_1$. The inter-level connection structure 508 connects an output terminal of an intermediate stage $402_{m-1}$ to an input terminal of a next stage $402_m$, where m is an integer smaller than n (e.g., m=(n+3)/2). As an example, the inter-level connection structures 506 and 508 and the intra-level connection structures (e.g., the connection structure 510) are approximately equal in length. The inter-level connection structures 506 and 508 penetrate at least part of the device layer 504. In some embodiments, the first (n+1)/2 stages of the ring oscillator 400 are fabricated in the second device layer 504, and the rest of the stages of the ring oscillator 400 are fabricated in the first device layer 502.

Figure 6:
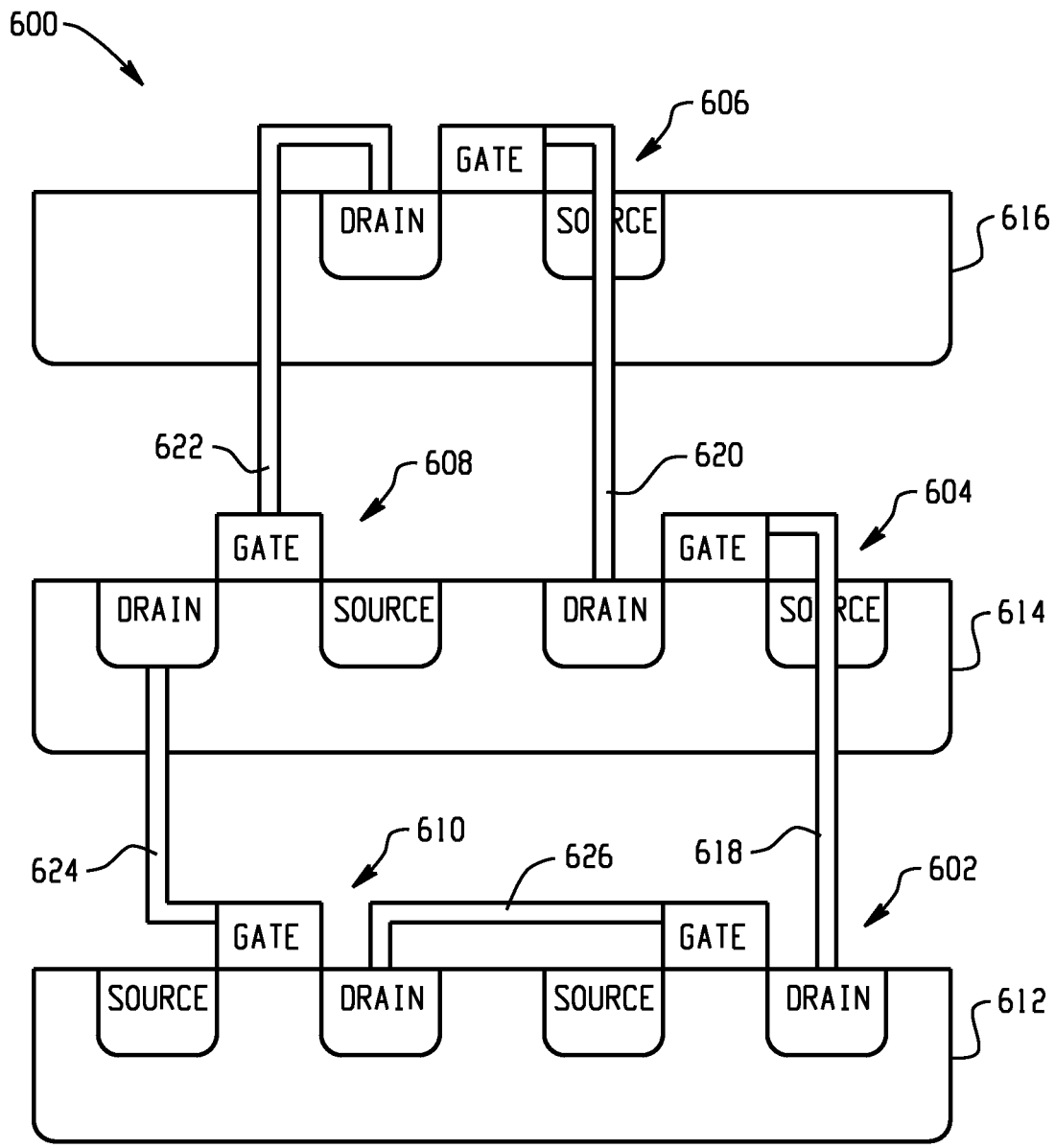
FIG. 6 depicts an example diagram of a five-stage ring oscillator fabricated using a three-layer structure.

FIG. 6 depicts an example diagram of a five-stage ring oscillator fabricated using a three-layer structure. As shown in FIG. 6, five stages 602, 604, 606, 608 and 610 of the ring oscillator 600 are fabricated in three device layers 612, 614 and 616. Specifically, the first stage 602 and the fifth stage 610 are fabricated in the first device layer 612, the second stage 604 and the fourth stage 608 are fabricated in the second device layer 614, and the third stage 606 is fabricated in the third device layer 616. Four inter-level connection structures 618, 620, 622 and 624 and an intra-level connection structure 626 are fabricated for interconnection of the stages 602, 604, 606, 608 and 610.

For example, transistors included in a particular stage of the ring oscillator 600 are fabricated in a single device layer. Locations of drain/source regions of the transistors in different stages may be adjusted to improve interconnections of various stages in the ring oscillator 600. As an example, the source regions of the transistors in the stage 604 may be fabricated at locations substantially above the drain regions of the transistors in the stage 602, and the source regions of the transistors in the stage 606 may be fabricated at locations substantially above the drain regions of the transistors in the stage 604.

Figure 7:
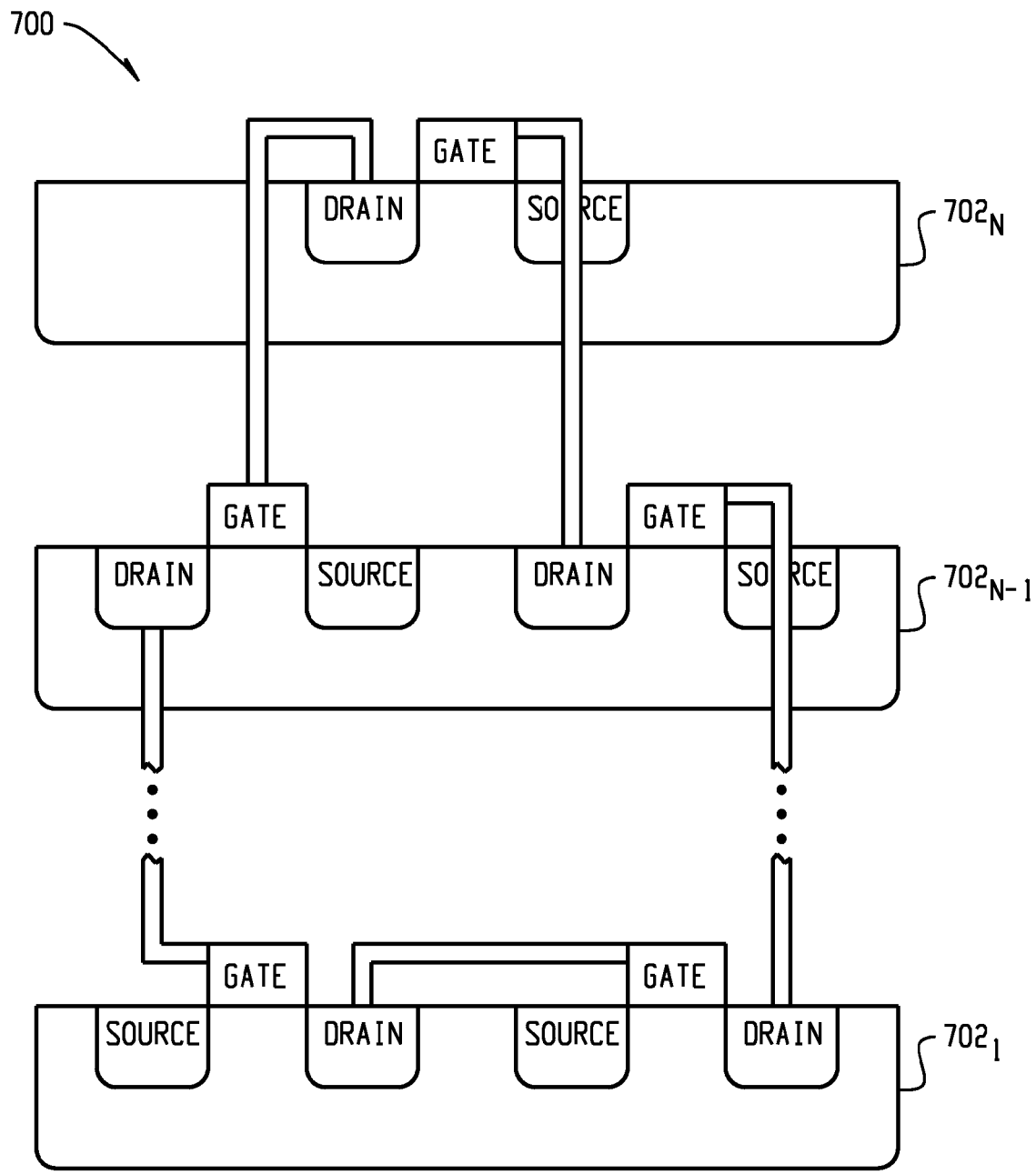
FIG. 7 depicts an example diagram of a multi-stage ring oscillator fabricated using a multi-layer structure.

FIG. 7 depicts an example diagram of a multi-stage ring oscillator fabricated using a multi-layer structure. As shown in FIG. 7, the multi-layer structure includes N device layers, $702_1, \ldots, 702_{N-1}$, and $702_N$, where N is an integer (e.g., larger than 3). Multiple stages of the ring oscillator 700 are fabricated on the N device layers. For example, two stages are fabricated in each of the device layers $702_1, \ldots, 702_{N-1}$, and one stage is fabricated in the device layer $702_N$. The multi-stage ring oscillator 700 includes (2N−1) stages in total.

Figure 8:
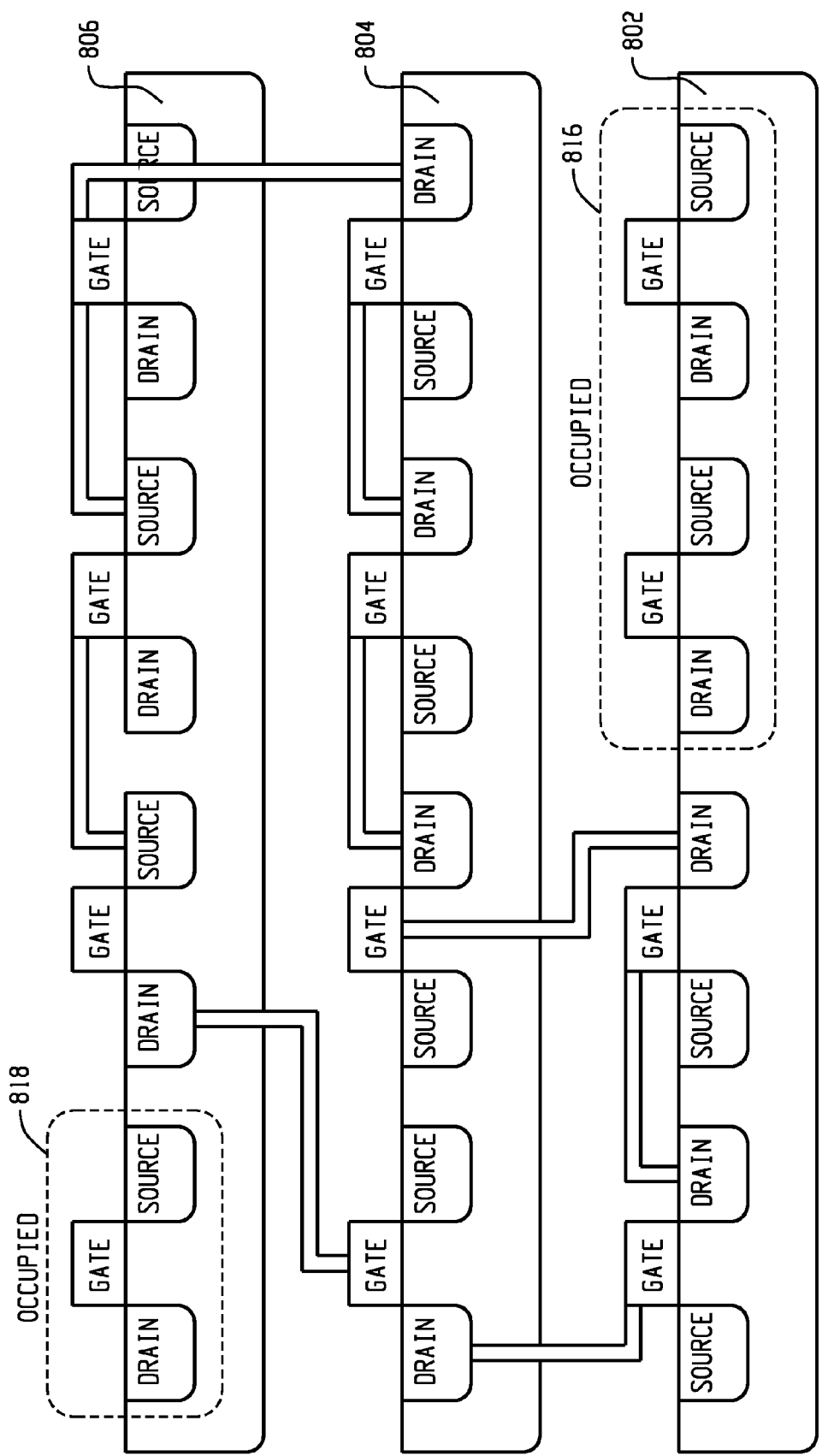
FIG. 8 depicts an example diagram of a multi-stage ring oscillator fabricated with other circuits on a same IC chip.

FIG. 8 depicts an example diagram of a multi-stage ring oscillator fabricated with other circuits on a same IC chip. A three-layer structure including device layers 802, 804 and 806 is used for fabricating a multi-stage ring oscillator. An area 816 in the device layer 802 and an area 818 in the device layer 806 may be reserved or occupied by other circuits. The multiple stages of the ring oscillator may be arranged in a particular way to accommodate other circuits, as shown in FIG. 8.

For example, the ring oscillator includes nine stages, and if there is no need to consider other circuits, each of three device layers 802, 804 and 806 may include three stages of the ring oscillator. Alternatively, the device layers 802, 804 and 806 may include four stages, three stages and two stages respectively, or any other proper arrangements. However, because the areas 816 and 818 include other circuits, the stages of the ring oscillator can be arranged to occupy the remaining real estate of the three device layers in order to accommodate the other circuits. As shown in FIG. 8, the device layers 802, 804, and 806 include two stages, four stages and three stages, respectively.

Figure 9:
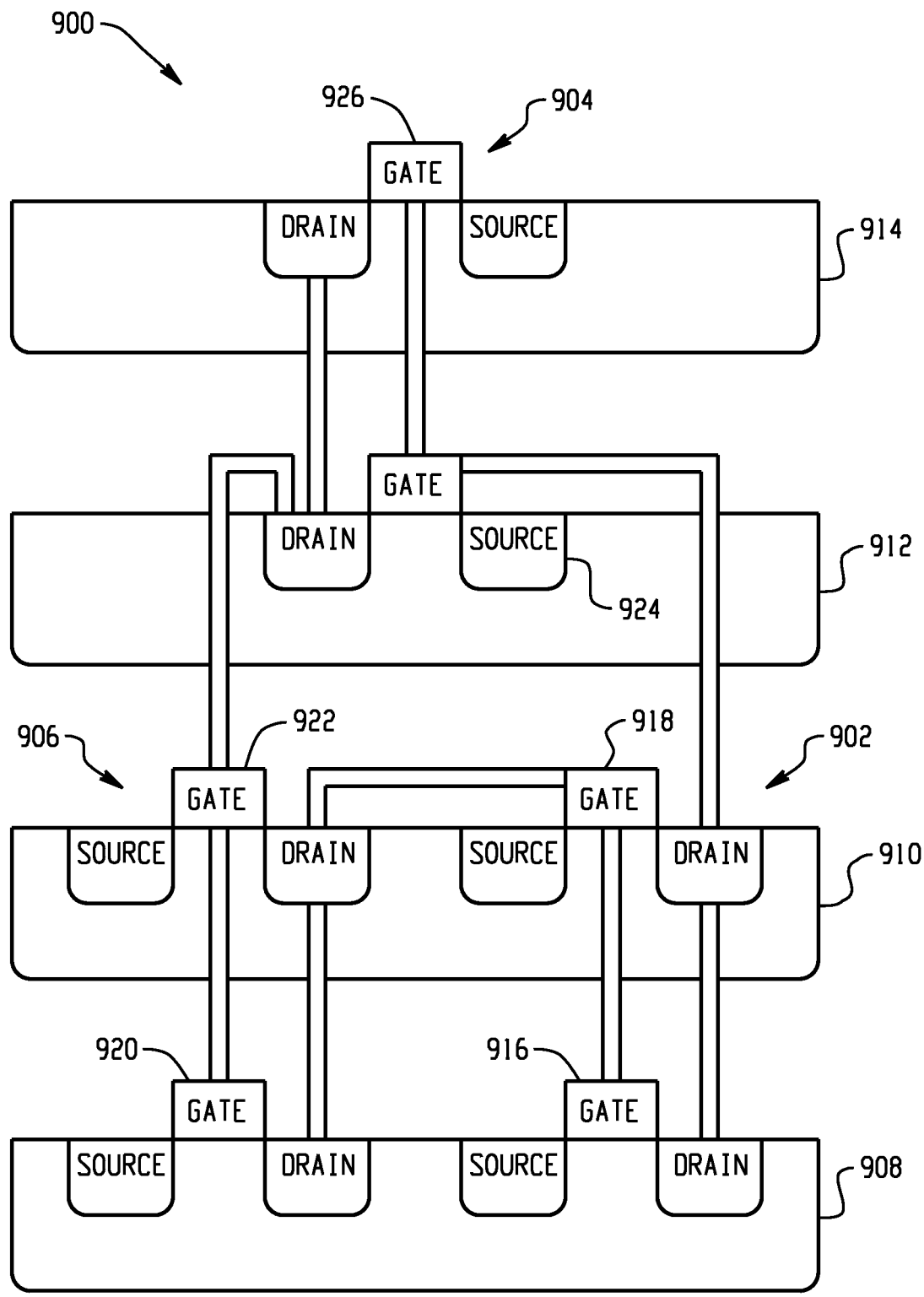
FIG. 9 depicts an example diagram of a multi-stage ring oscillator where transistors of a stage are fabricated on different device layers.

In certain embodiments, transistors included in a particular stage of a multi-stage ring oscillator may be fabricated in different device layers. FIG. 9 depicts an example diagram of a multi-stage ring oscillator where transistors of a stage are fabricated on different device layers. As shown in FIG. 9, the ring oscillator 900 that includes three stages 902, 904 and 906 are fabricated in four device layers 908, 910, 912 and 914. Each stage of the ring oscillator 900 includes a P-channel transistor and an N-channel transistor which may be fabricated in different device layers.

In an embodiment, the stage 902 includes a P-channel transistor 918 and an N-channel transistor 916, where the transistor 916 is fabricated in the device layer 908 and the transistor 918 is fabricated in the device layer 910. Similarly, in the stage 906, a P-channel transistor 922 is fabricated in the device layer 910 and an N-channel transistor 920 is fabricated in the device layer 908. In addition, the stage 904 includes a P-channel transistor 924 and an N-channel transistor 926, where the transistor 924 is fabricated in the device layer 912 and the transistor 926 is fabricated in the device layer 914. In other embodiments, one or more of these transistors may be fabricated in the device layers different from what are described above. For example, the transistor 916 is fabricated in the device layer 910 and the transistor 918 is fabricated in the device layer 908.

Figure 10:
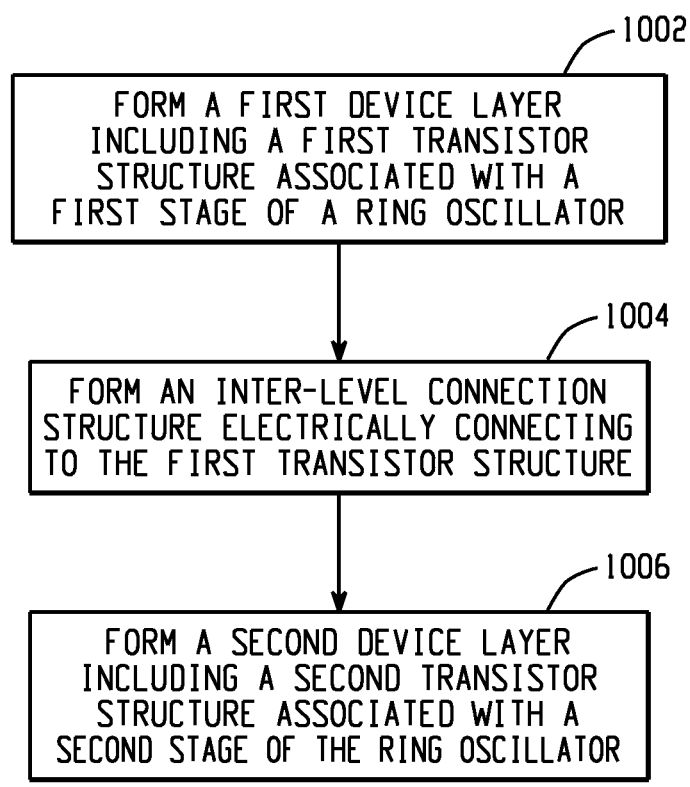
FIG. 10 depicts an example flow chart for fabricating a ring oscillator including a plurality of stages using a multi-layer structure.

FIG. 10 depicts an example flow chart for fabricating a ring oscillator including a plurality of stages using a multi-layer structure. At 1002, a first device layer is formed. The first device layer includes a first transistor structure associated with a first stage of a ring oscillator. At 1004, a first inter-level connection structure is formed. The first inter-level connection structure includes one or more first conductive materials, and electrically connects to the first transistor structure. At 1006, a second device layer is formed on the first device layer. The second device layer includes a second transistor structure associated with a second stage of the ring oscillator, where the second transistor structure electrically connects to the inter-level connection structure.

In some embodiments, a third transistor structure is formed in the first device layer and is associated with a third stage of the ring oscillator. The third transistor structure is configured to electrically connect to the first transistor structure. A second inter-level connection structure that includes one or more second conductive materials is configured to electrically connect to the second transistor structure and the third transistor structure.

In certain embodiments, a fourth transistor structure is formed in the second device layer and is associated with a fourth stage of the ring oscillator. A fifth transistor structure is formed in the first device layer and is associated with a fifth stage of the ring oscillator. A third inter-level connection structure that includes one or more third conductive materials is configured to electrically connect to the fourth transistor structure and the fifth transistor structure. The third transistor structure is configured to electrically connect to the fifth transistor structure. The fourth transistor structure is configured to electrically connect to the second transistor structure. In other embodiments, the fifth transistor structure is formed in a third device layer, instead of the first device layer. Another inter-level connection structure is configured to electrically connect to the fourth transistor structure and the fifth transistor structure.

In one embodiment, the ring oscillator includes multiple transistor structures, for example, more than five. These transistor structures may be fabricated in several device layers, and the arrangement of the transistor structures in different device layers may be determined to use the real estate of the multi-layer structure efficiently and to accommodate other circuits (e.g., as shown in FIG. 8).

In some embodiments, a device layer (e.g., the first device layer, the second device layer) includes multiple sub-layers. A transistor structure formed in the device layer includes an N-channel transistor and a P-channel transistor, where the N-channel transistor is formed in one sub-layer, and the P-channel transistor is formed in another sub-layer.

This written description uses examples to disclose embodiments of the disclosure, include the best mode, and also to enable a person of ordinary skill in the art to make and use various embodiments of the disclosure. The patentable scope of the disclosure may include other examples that occur to those of ordinary skill in the art. One of ordinary skill in the relevant art will recognize that the various embodiments may be practiced without one or more of the specific details, or with other replacement and/or additional methods, materials, or components. For example, certain transistors are described herein as examples, and the concepts, structures, layouts, materials, or operations may also be applicable to other types of semiconductor devices, such as bipolar junction transistors, diodes, capacitors, etc. As an example, the structures, layouts, materials, operations, voltage levels, or current levels related to "source" and "drain" described herein (including in the claims) may be interchangeable as a result of transistors with "source" and "drain" being symmetrical devices. Well-known structures, materials, or operations may not be shown or described in detail to avoid obscuring aspects of various embodiments of the disclosure. Various embodiments shown in the figures are illustrative example representations and are not necessarily drawn to scale. Particular features, structures, materials, or characteristics may be combined in any suitable manner in one or more embodiments. Various additional layers and/or structures may be included and/or described features may be omitted in other embodiments. For example, a particular layer described herein may include multiple components which are not necessarily connected physically or electrically. Various operations may be described as multiple discrete operations in turn, in a manner that is most helpful in understanding the disclosure. However, the order of description should not be construed as to imply that these operations are necessarily order dependent. In particular, these operations need not be performed in the order of presentation. Operations described herein may be performed in a different order, in series or in parallel, than the described embodiments. Various additional operations may be performed and/or described. Operations may be omitted in additional embodiments.

This written description and the following claims may include terms, such as left, right, top, bottom, over, under, upper, lower, first, second, etc. that are used for descriptive purposes only and are not to be construed as limiting. For example, the term "on" as used herein (including in the claims) may not indicate that a first layer "on" a second layer is directly on and in immediate contact with the second layer unless such is specifically stated; there may be a third layer or other structure between the first layer and the second layer on the first layer. The term "under" as used herein (including in the claims) may not indicate that a first layer "under" a second layer is directly under and in immediate contact with the second layer unless such is specifically stated; there may be a third layer or other structure between the first layer and the second layer under the first layer. The term "in" used herein (including in the claims) for a situation where a device/component is fabricated "in" a layer does not indicate that all parts of the device/component are completely contained inside the layer; there may be one or more parts of the device/component exist outside of the layer. The embodiments of a device or article described herein can be manufactured, used, or shipped in a number of positions and orientations. Persons skilled in the art will recognize various equivalent combinations and substitutions for various components shown in the figures.

What is claimed is:

1. A multi-layer structure, comprising:
   a first device layer including a first transistor structure associated with a first stage of a ring oscillator;
   a second device layer formed on the first device layer and including a second transistor structure associated with a second stage of the ring oscillator;
   a first inter-level connection structure including one or more first conductive materials and configured to electrically connect to the first transistor structure and the second transistor structure;
   a third transistor structure formed in the first device layer and associated with a third stage of the ring oscillator, the third transistor structure being configured to electrically connect to the first transistor structure; and a second inter-level connection structure including one or more second conductive materials and configured to electrically connect to the second transistor structure and the third transistor structure.

2. The multi-layer structure of claim 1, wherein:

the first transistor structure includes a first gate electrode structure, a first source electrode structure, and a first drain electrode structure;

the second transistor structure includes a second gate electrode structure, a second source electrode structure, and a second drain electrode structure; and the first inter-level connection structure is configured to electrically connect to the first drain electrode structure and the second gate electrode structure.

3. The multi-layer structure of claim 2, wherein:

the first transistor structure includes an N-channel transistor and a P-channel transistor, the N-channel transistor including a first gate terminal, a first source terminal and a first drain terminal, the P-channel transistor including a second gate terminal, a second source terminal and a second drain terminal;

the first gate electrode structure is configured to electrically connect to the first gate terminal of the first transistor structure and the second gate terminal of the first transistor structure; and the first drain electrode structure is configured to electrically connect to the first drain terminal of the first transistor structure and the second drain terminal of the first transistor structure.

4. The multi-layer structure of claim 2, wherein:

the second transistor structure includes an N-channel transistor and a P-channel transistor, the N-channel transistor including a first gate terminal, a first source terminal and a first drain terminal, the P-channel transistor including a second gate terminal, a second source terminal and a second drain terminal;

the second gate electrode structure is configured to electrically connect to the first gate terminal of the second transistor structure and the second gate terminal of the second transistor structure; and the second drain electrode structure is configured to electrically connect to the first drain terminal of the second transistor structure and the second drain terminal of the second transistor structure.

5. The multi-layer structure of claim 1, wherein:

the third transistor structure includes a third gate electrode structure, a third source electrode structure, and a third drain electrode structure;

the second inter-level connection structure is configured to electrically connect to a second drain electrode structure of the second transistor structure and the third gate electrode structure; and a first gate electrode structure of the first transistor structure is configured to electrically connect to the third drain electrode structure.

6. The multi-layer structure of claim 1, wherein:

the third transistor structure includes an N-channel transistor and a P-channel transistor, the N-channel transistor including a first gate terminal, a first source terminal and a first drain terminal, the P-channel transistor including a second gate terminal, a second source terminal and a second drain terminal;

the third gate electrode structure is configured to electrically connect to the first gate terminal of the third transistor structure and the second gate terminal of the third transistor structure; and the third drain electrode structure is configured to electrically connect to the first drain terminal of the third transistor structure and the second drain terminal of the third transistor structure.

7. The multi-layer structure of claim 1, further comprising:

a fourth transistor structure formed in the second device layer and associated with a fourth stage of the ring oscillator;

a fifth transistor structure formed in the first device layer and associated with a fifth stage of the ring oscillator; and a third inter-level connection structure including one or more third conductive materials and configured to electrically connect to the fourth transistor structure and the fifth transistor structure;

wherein: the third transistor structure is configured to electrically connect to the fifth transistor structure; and the fourth transistor structure is configured to electrically connect to the second transistor structure.

8. The multi-layer structure of claim 1, further comprising:

a fourth transistor structure formed in the second device layer and associated with a fourth stage of the ring oscillator;

a third device layer including a fifth transistor structure associated with a fifth stage of the ring oscillator; and a third inter-level connection structure including one or more third conductive materials and configured to electrically connect to the fourth transistor structure and the fifth transistor structure.

9. The multi-layer structure of claim 8, further comprising:

a fourth inter-level connection structure including one or more fourth conductive materials and configured to electrically connect to the second transistor structure and the fifth transistor structure; and a fifth inter-level connection structure including one or more fifth conductive materials and configured to electrically connect to the third transistor structure and the fourth transistor structure.

10. The multi-layer structure of claim 1, wherein:

the first device layer includes a third device layer and a fourth device layer; and the first transistor structure includes a first N-channel transistor and a first P-channel transistor, the first N-channel transistor being formed in the third device layer, the first P-channel transistor being formed in the fourth device layer.

11. The multi-layer structure of claim 1, wherein:

the first transistor structure includes a first gate electrode structure, a first source electrode structure, and a first drain electrode structure;

the first N-channel transistor includes a first gate terminal, a first source terminal and a first drain terminal;

the first P-channel transistor includes a second gate terminal, a second source terminal and a second drain terminal;

the first gate electrode structure is configured to electrically connect to the first gate terminal of the first transistor structure and the second gate terminal of the first transistor structure; and the first drain electrode structure is configured to electrically connect to the first drain terminal of the first transistor structure and the second drain terminal of the first transistor structure.

12. The multi-layer structure of claim 10, further comprising:
- a third transistor structure formed in the first device layer and associated with a third stage of the ring oscillator;
- wherein the third transistor structure includes a second N-channel transistor and a second P-channel transistor, the second N-channel transistor being formed in the third device layer, the second P-channel transistor being formed in the fourth device layer.

13. The multi-layer structure of claim 1, wherein:
- the second device layer includes a third device layer and a fourth device layer; and
- the second transistor structure includes an N-channel transistor and a P-channel transistor, the N-channel transistor being formed in the third device layer, the P-channel transistor being formed in the fourth device layer.

14. The multi-layer structure of claim 13, wherein:
- the second transistor structure includes a second gate electrode structure, a second source electrode structure, and a second drain electrode structure;
- the N-channel transistor includes a first gate terminal, a first source terminal and a first drain terminal;
- the P-channel transistor includes a second gate terminal, a second source terminal and a second drain terminal;
- the second gate electrode structure is configured to electrically connect to the first gate terminal of the second transistor structure and the second gate terminal of the second transistor structure; and
- the second drain electrode structure is configured to electrically connect to the first drain terminal of the second transistor structure and the second drain terminal of the second transistor structure.

15. The multi-layer structure of claim 1, further comprising:
- a third device layer formed on the second device layer and including a third transistor structure associated with a third stage of the ring oscillator; and
- a second inter-level connection structure including one or more second conductive materials and configured to electrically connect to the third transistor structure and the second transistor structure;
- wherein: the third device layer includes a fourth device layer and a fifth device layer; and
- the third transistor structure includes an N-channel transistor and a P-channel transistor, the N-channel transistor being formed in the fourth device layer, the P-channel transistor being formed in the fifth device layer.

16. The multi-layer structure of claim 15, wherein:
- the third transistor structure includes a third gate electrode structure, a third source electrode structure, and a third drain electrode structure;
- the N-channel transistor includes a first gate terminal, a first source terminal and a first drain terminal;
- the P-channel transistor includes a second gate terminal, a second source terminal and a second drain terminal;
- the third gate electrode structure is configured to electrically connect to the first gate terminal of the third transistor structure and the second gate terminal of the third transistor structure; and
- the third drain electrode structure is configured to electrically connect to the first drain terminal of the third transistor structure and the second drain terminal of the third transistor structure.

17. A ring oscillator, comprising:
- a first stage including a first transistor structure formed in a first device layer of a multi-layer structure; and
- a second stage including a second transistor structure formed in a second device layer of the multi-layer structure, the second device layer being formed on the first device layer;
- wherein the first transistor structure is configured to electrically connect to the second transistor structure through a first inter-level connection structure including one or more first conductive materials,
- a third stage including a third transistor structure formed in the first device layer;
- wherein the first transistor structure is configured to electrically connect to the third transistor structure, and the second transistor structure is configured to electrically connect to the third transistor structure through a second inter-level connection structure including one or more second conductive materials.

18. A method for fabricating a ring oscillator including a plurality of stages using a multi-layer structure, the method comprising:
- forming a first device layer including a first transistor structure associated with a first stage of a ring oscillator;
- forming an inter-level connection structure including one or more first conductive materials, the inter-level connection structure electrically connecting to the first transistor structure;
- forming a second device layer on the first device layer, the second device layer including a second transistor structure associated with a second stage of the ring oscillator, the second transistor structure electrically connecting to the inter-level connection structure;
- forming a third transistor structure formed in the first device layer and associated with a third stage of the ring oscillator, the third transistor structure electrically connecting to the first transistor structure; and
- forming a second inter-level connection structure including one or more second conductive materials, the second inter-level connection electrically connecting to the second transistor structure and the third transistor structure.

19. A multi-layer structure, comprising:
- a first device layer including a first transistor structure associated with a first stage of a ring oscillator;
- a second device layer formed on the first device layer and including a second transistor structure associated with a second stage of the ring oscillator;
- a first inter-level connection structure including one or more first conductive materials and configured to electrically connect to the first transistor structure and the second transistor structure;
- wherein the first device layer includes a third device layer and a fourth device layer; and
- the first transistor structure includes a first N-channel transistor and a first P-channel transistor, the first N-channel transistor being formed in the third device layer, the first P-channel transistor being formed in the fourth device layer.

20. A ring oscillator, comprising:
- a first inverter formed in a first device layer of a multi-layer structure; and
- a second inverter formed in a second device layer of the multi-layer structure, the second device layer being formed on the first device layer;
- wherein the first inverter is configured to electrically connect to the second inverter through a first inter-level connection structure including one or more first conductive materials.

21. A multi-layer structure, comprising:
a first device layer including a first inverter associated with a first stage of a ring oscillator;
a second device layer formed on the first device layer and including a second inverter associated with a second stage of a ring oscillator; and
a first inter-level connection structure including one or more first conductive materials and configured to electrically connect to the first inverter and the second inverter.

* * * * *